United States Patent
Hsia

(10) Patent No.: US 6,358,775 B1
(45) Date of Patent: Mar. 19, 2002

(54) MULTI-DIE SEMICONDUCTOR ENCAPSULATION METHOD

(76) Inventor: Kuang Yao Hsia, 14-1, Alley 33, Lane 105, Yeong Kang Rd., Feng-Yuan, Taichung (TW)

( * ) Notice: Subject to any disclaimer, the term of this patent is extended or adjusted under 35 U.S.C. 154(b) by 0 days.

(21) Appl. No.: 09/557,657

(22) Filed: Apr. 25, 2000

Related U.S. Application Data

(62) Division of application No. 09/296,865, filed on Apr. 22, 1999, now Pat. No. 6,163,068.

(51) Int. Cl.$^7$ .............................................. H01L 21/44
(52) U.S. Cl. ....................... 438/112; 438/111; 438/123; 438/124
(58) Field of Search ................................ 438/107, 111, 438/112, 123, 124, 126, 127

(56) References Cited

U.S. PATENT DOCUMENTS

| | | | | |
|---|---|---|---|---|
| 5,278,101 A | * | 1/1994 | Ikenoue ....................... | 438/123 |
| 5,434,106 A | * | 7/1995 | Lim et al. .................... | 438/123 |
| 5,763,294 A | * | 6/1998 | Lin ............................. | 438/111 |
| 5,858,815 A | * | 1/1999 | Heo et al. ..................... | 438/112 |
| 5,933,708 A | * | 8/1999 | Sim et al. ..................... | 438/123 |
| 6,066,888 A | * | 5/2000 | Yanagisawa ................. | 438/123 |
| 6,200,833 B1 | * | 3/2001 | Jiang et al. .................. | 438/111 |

* cited by examiner

*Primary Examiner*—Kevin M. Picardat
(74) *Attorney, Agent, or Firm*—Pro-TECHTOR International Services

(57) ABSTRACT

A multi-die semiconductor encapsulation method, which includes the steps of (1) preparing a lead-frame having a center open area and parallel rows of pins around said center open area, (2) preparing a substrate having a plurality of die positioning zones at the center area of the back side wall thereof, a window respectively disposed at the center of each die positioning zone, conductor elements respectively disposed at the top side wall thereof around each window, and peripheral rows of terminals, (3) preparing a plurality of dies each having a plurality of solder tips and then fastening the dies to the die positioning zones at the substrate, (4) using conductor wires to connect the solder tips at the dies to the conductor elements at the substrate, (5) mounting the substrate in the center open area at the lead-frame and then connecting the terminals at the substrate to the pins at the lead frame respectively, and (6) encapsulating the assembly of the substrate, the lead-frame and the die into a multi-die semiconductor.

4 Claims, 6 Drawing Sheets

MULTI-DIE SEMICONDUCTOR ENCAPSULATION METHOD

This is a divisional application of applicant's U.S. patent application Ser. No. 09/296,865, filed on Apr. 22, 1999, now U.S. Pat. No. 6,163,068.

BACKGROUND OF THE INVENTION

The present invention relates to a semiconductor encapsulation method, and more particularly to a multi-die semiconductor encapsulation method what enables multiple dies to be encapsulated into an integrated circuit. The invention relates also to a multi-die semiconductor made according to this method.

Because modern computer systems are sophisticated, the effective capacity of related integrated circuits must be relatively expanded to meet the requirements. However, according to current chip manufacturing processes, the greater the capacity is the larger the chip dimension and the higher the chip manufacturing cost will be. Multi-die encapsulation can increase the capacity without increasing many dimensions.

SUMMARY OF THE INVENTION

It is one object of the present invention to provide a semiconductor encapsulation method which enables multiple dies to be encapsulated into an integrated circuit. It is another object of the present invention to provide an integrated circuit which has multiple dies encapsulated in it. A multi-die semiconductor encapsulation method according to the present invention comprises the steps of:

(1) preparing a lead-frame having a center open area and parallel rows of pins around the center open area;

(2) preparing a substrate having a plurality of die positioning zones at the center area of the back side wall thereof, a window respectively disposed at the center of each die positioning zone, conductor elements respectively disposed at the top side wall thereof around each window, and peripheral rows of terminals;

(3) preparing a plurality of dies each having a plurality of solder tips and then fastening the dies to the die positioning zones at the substrate;

(4) using conductor wires to connect the solder tips at the dies to the conductor elements at the substrate;

(5) mounting the substrate in the center open area at the lead-frame and then connecting the terminals at the substrate to the pins at the lead-frame respectively; and (6) encapsulating the assembly of the substrate, the lead frame and the die into a multi-die semiconductor.

A finished multi-die semiconductor in accordance with the present invention comprises:

a lead-frame, the lead-frame having a center open area, and parallel rows of pins disposed at least two of four peripheral sides thereof around the center open area;

a substrate mounted in the center open area at the lead frame, the substrate comprising a plurality of die positioning zones at the center area of a back side wall thereof, a window respectively disposed at the center of each of the die positioning zones, conductor elements respectively disposed at a top side wall thereof around each window, and rows of terminals disposed at least two of four peripheral sides thereof and respectively connected to the pins at the lead-frame;

a plurality of dies respectively mounted in the die positioning zones at the back side wall of the substrate, the dies each having a plurality of solder tips respectively suspended in the windows in the substrate corresponding to the conductor elements at the substrate; and conductor wires respectively connected between the solder tips at the dies and the conductor elements at the substrate.

DETAILED DESCRIPTION OF THE PREFERRED EMBODIMENT

Figure 1:
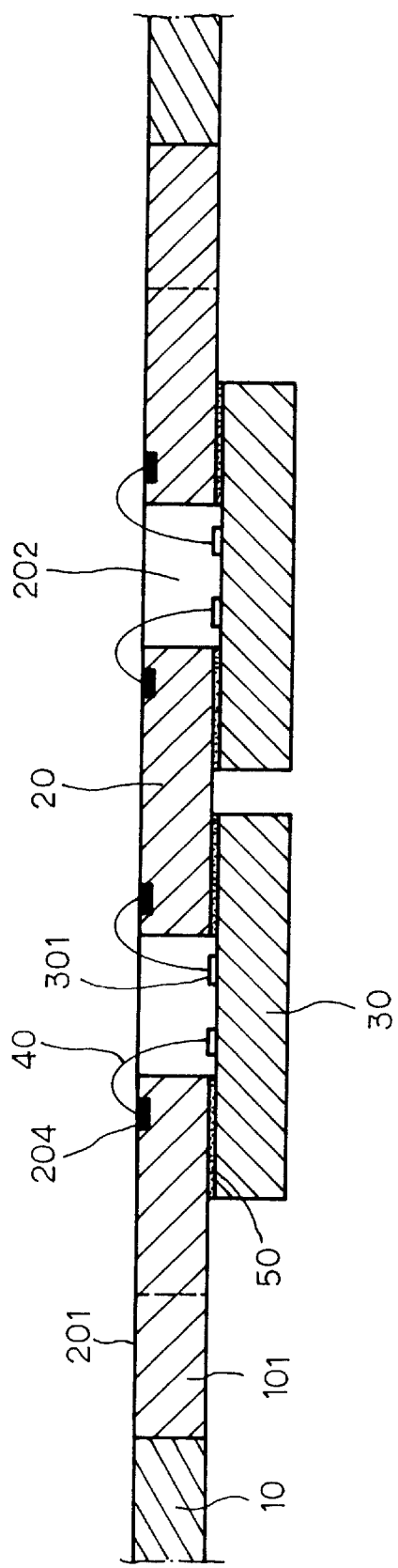
FIG. 1 is a sectional view of a multi-die semiconductor according to one embodiment of the present invention.

FIG. 1 and FIGS. from 2A through 2D show a preferred embodiment of the present invention. This embodiment explains a 4-die LOC (line of communication) encapsulation. However, the invention is not limited to this encapsulation.

Figure 2A:
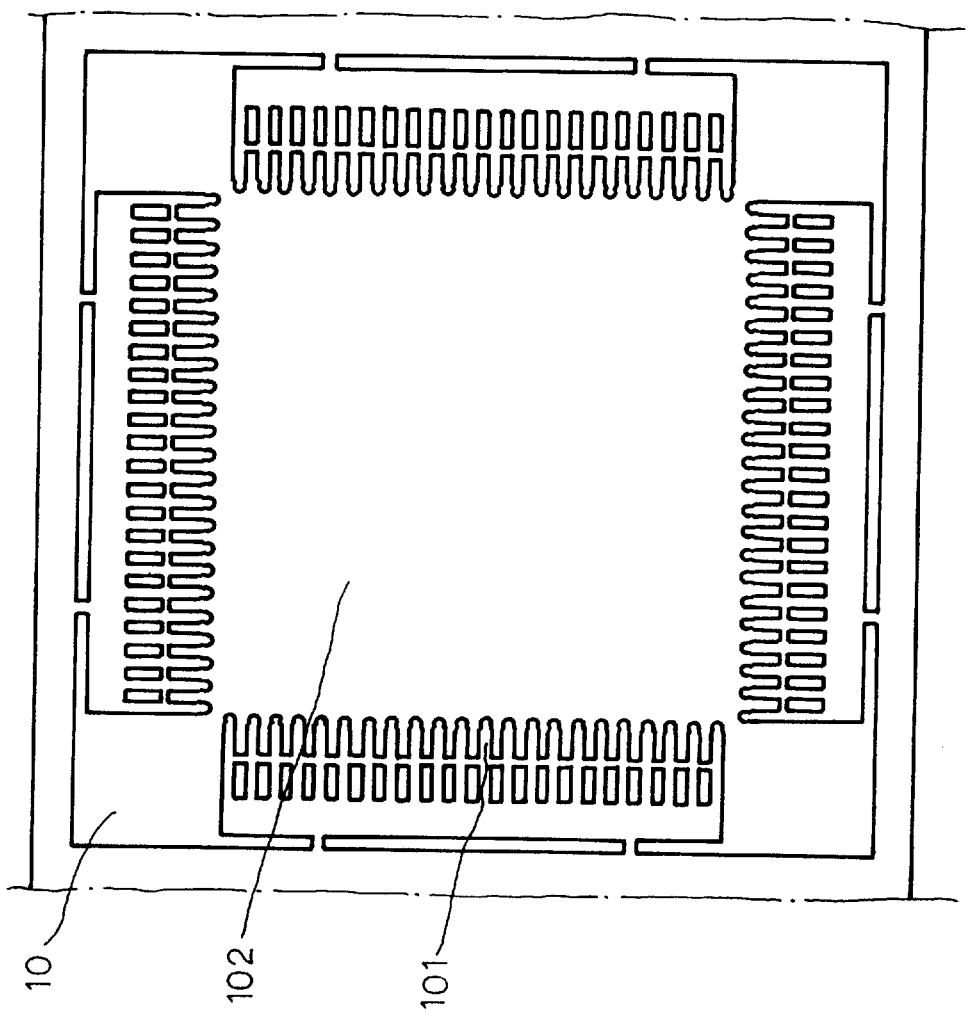
FIG. 2A is a schematic drawing showing the structure of a lead-frame according to the present invention.

Referring to FIGS. 1 and 2A, a lead-frame 10 is provided having a center open area 102, which holds a substrate 20, and parallel rows of pins 101 disposed at two or four sides, for example, the four sides around the center open area 102.

Figure 2B:
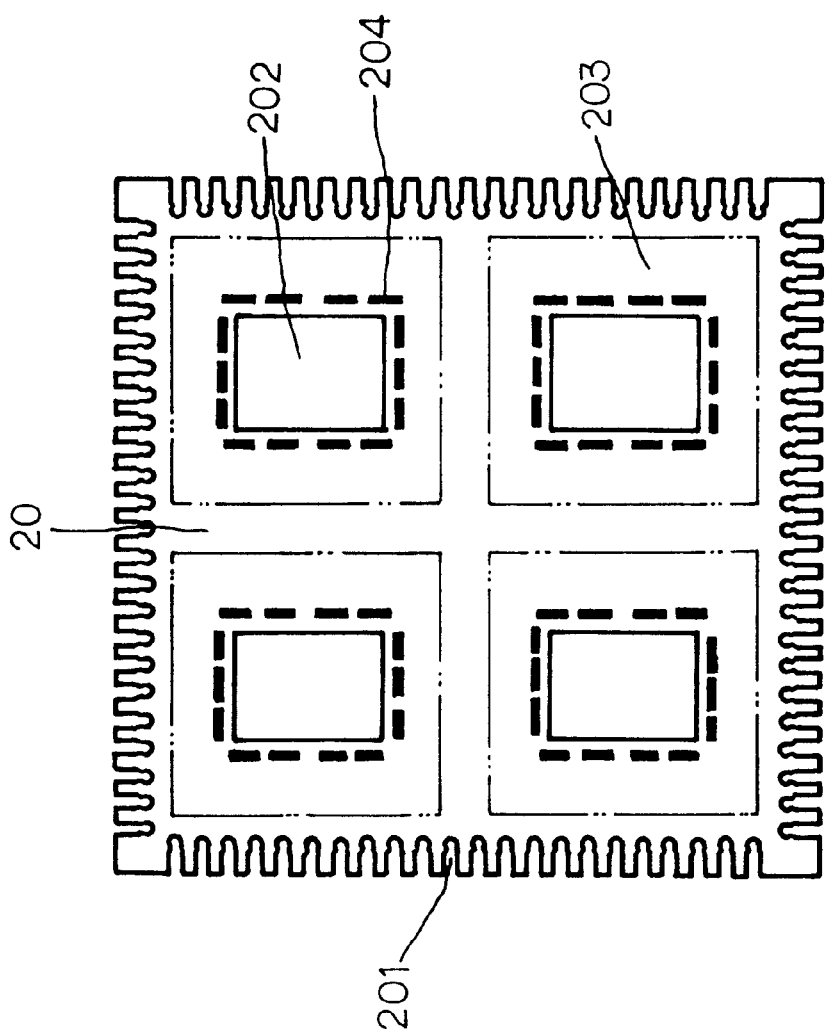
FIG. 2B is a schematic drawing showing the structure of a substrate according to the present invention.

Referring to FIG. 2B and FIG. 1 again, a substrate 20 is shown having a plurality of, for example, four die positioning zones 203 at the center area of the back side wall thereof (see the imaginary lines) which hold a respective die 30, a window 202 respectively disposed at the center of each of the die positioning zones 203, conductor elements 204 respectively disposed at the top side wall thereof around each window 202 corresponding to respective solder tips 301 at the die 30 in each of the die positioning zones 203 for communication between the substrate 20 and each die 30, and rows of terminals 201 at two or four sides, for example, the four sides around the periphery for enabling the substrate 20 to communicate with external means.

Figure 2C:
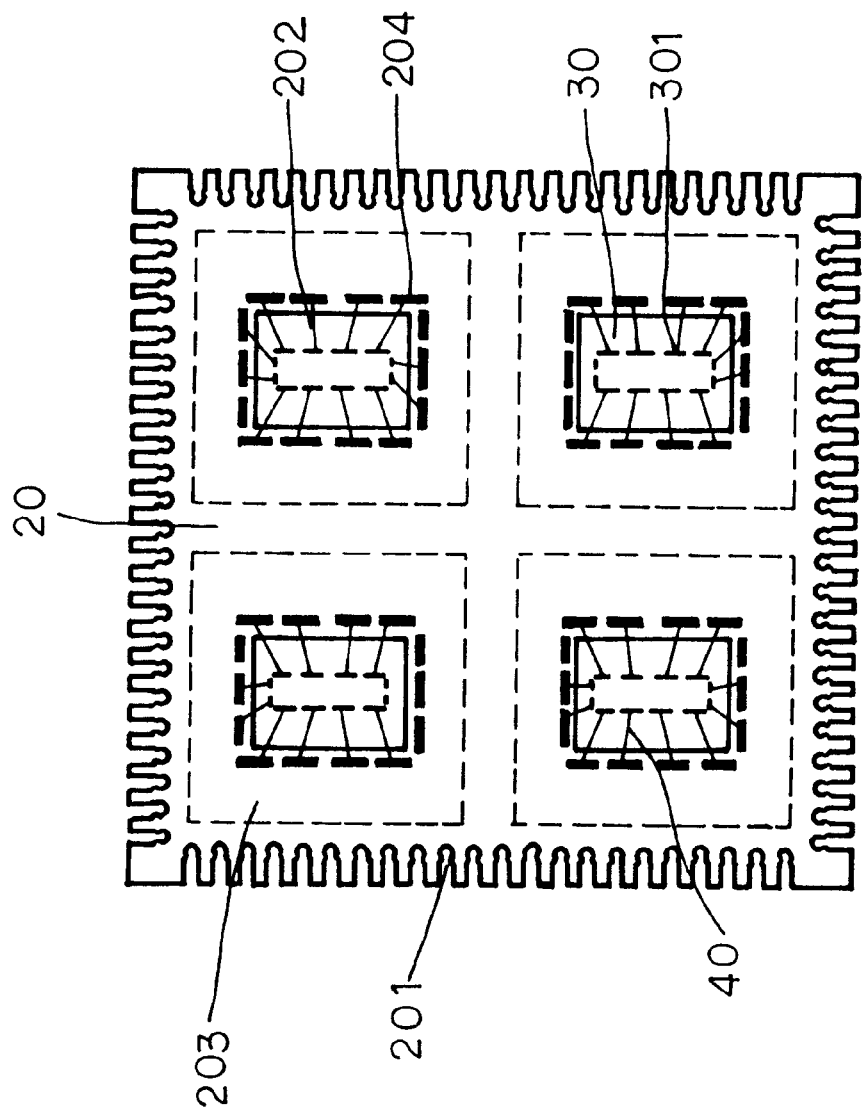
FIG. 2C is a schematic drawing showing dies installed in die positioning zones at the substrate according to the present invention.

Referring to FIG. 2C and FIG. 1 again, the dies 30 are respectively adhered to the die positioning zones 203 at the back side wall of the substrate 20 by for example doublesided adhesive means 50, and the solder tips 301 of the dies 30 are respectively suspended in the windows 202 in the substrate 20 corresponding to the conductor elements 204 at the substrate 20. Conductor wires 40 are respectively installed, and connected between the solder tips 301 at the dies 30 and the conductor elements 204 at the substrate 20. The conductor wires 40 can be gold-plated wires, silver-plated wires, or lead wires.

Figure 2D:
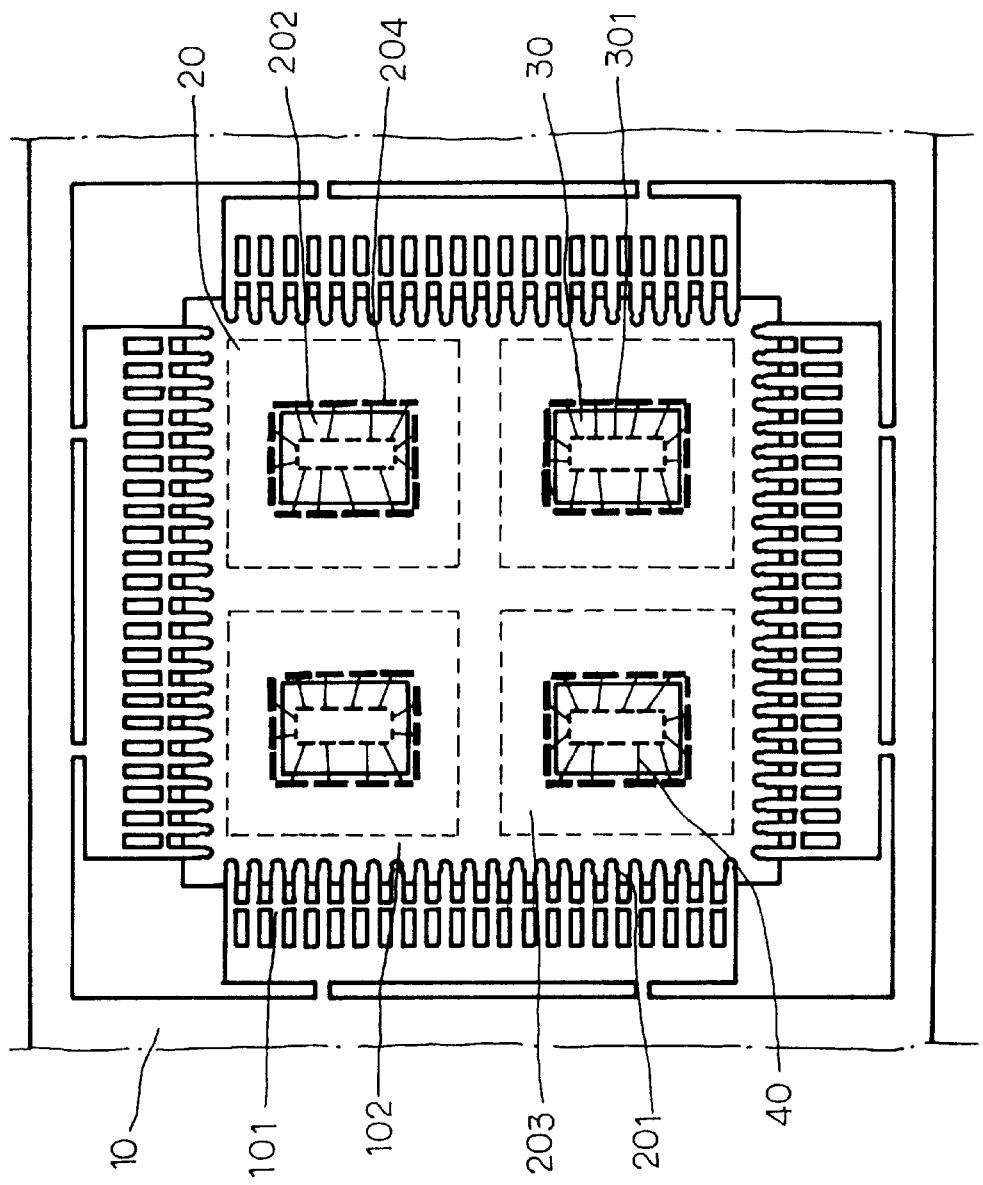
FIG. 2D is a schematic drawings showing dies carried on the substrate, the substrate installed in the lead-frame according to the present invention.
Figure 3:
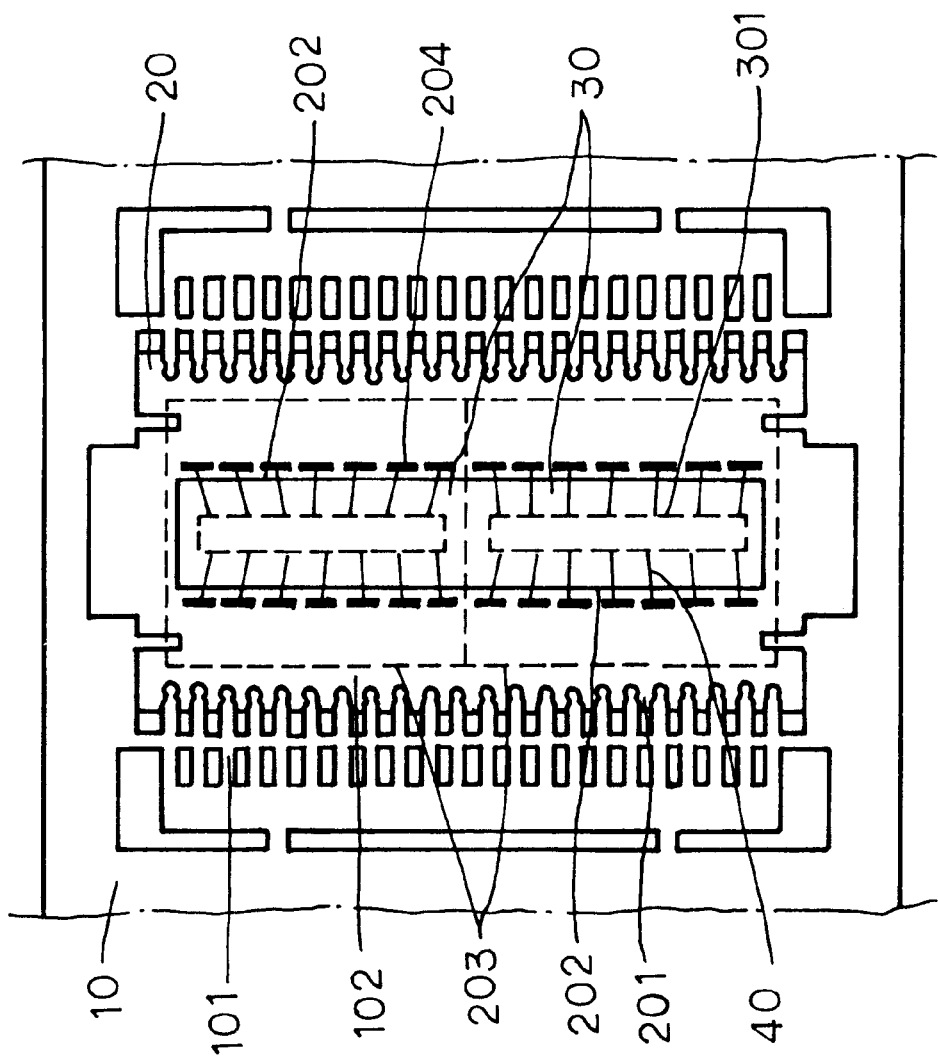
FIG. 3 illustrates a double die encapsulation example of the present invention.

Referring to FIG. 2D and FIG. 1 again, the substrate 20 which carries the dies 30 is mounted in the center open area 102 at the lead-frame 10, and the terminals 201 of the substrate 20 are respectively soldered to the pins 101 at the lead-frame 10. After installation of the substrate 20 in the lead-frame 10, the whole assembly is encapsulated, and a multi-die semiconductor is thus finished.

It is to be understood that the drawings are designed for purposes of illustration only, and are no used as a definition of the limitations and scope of the invention disclosed. For example, the solder tips 301 of each die 30 can be provided at the peripheral area instead of the center area.

What the invention claimed is:

1. A multi-die semiconductor encapsulation method comprising the steps of:
   (a) preparing a lead-frame, said lead-frame having a center open area, and parallel rows of pins disposed at least two of four peripheral sides thereof around said center open area;
   (b) preparing a substrate, said substrate having a plurality of die positioning zones at a center area of a back side wall thereof, a window respectively disposed at a center of each of said die positioning zones, conductor elements disposed at a top side wall thereof around each window, and rows of terminals at least two of four sides;
   (c) preparing a plurality of dies each having a plurality of solder tips, and fastening said dies to the die positioning zones at the back side wall of said substrate, enabling said solder tips to be suspended in the windows in said substrate corresponding to respective conductor elements at said substrate;
   (d) using conductor wires to connect the solder tips to said dies and said conductor elements to said substrate;
   (e) mounting said substrate in the center open area at said lead-frame, and then connecting the terminals at said substrate to the pins at said lead-frame respectively; and
   (f) encapsulating the assembly of said substrate, said lead-frame and said die into a multi-die semiconductor.

2. The multi-die semiconductor encapsulation method of claim 1 wherein the terminals at said substrate are connected to the pins at said lead-frame by soldering.

3. The multi-die semiconductor encapsulation method of claim 1 wherein said dies are fastened to the die positioning zones at the back side wall of said substrate by double-sided adhesive means.

4. The multi-die semiconductor encapsulation method of claim 1 wherein said dies are fastened to the die positioning zones at the back side wall of said substrate by an adhesive.

* * * * *